(12) United States Patent
Lee et al.

(10) Patent No.: US 10,879,115 B2
(45) Date of Patent: Dec. 29, 2020

(54) SEMICONDUCTOR DEVICE AND FORMING METHOD THEREOF

(71) Applicant: TAIWAN SEMICONDUCTOR MANUFACTURING CO., LTD., Hsinchu (TW)

(72) Inventors: Ming-Han Lee, Taipei (TW); Shih-Kang Fu, Taoyuan County (TW); Meng-Pei Lu, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/820,419

(22) Filed: Nov. 21, 2017

(65) Prior Publication Data

US 2019/0157144 A1    May 23, 2019

(51) Int. Cl.
*H01L 21/768*    (2006.01)
*H01L 23/528*    (2006.01)
*H01L 23/532*    (2006.01)
*H01L 21/321*    (2006.01)

(52) U.S. Cl.
CPC .... *H01L 21/76864* (2013.01); *H01L 21/3212* (2013.01); *H01L 21/76843* (2013.01); *H01L 23/5283* (2013.01); *H01L 23/53238* (2013.01); *H01L 23/53266* (2013.01)

(58) Field of Classification Search
CPC .................. H01L 21/76843; H01L 23/5283
See application file for complete search history.

(56) References Cited

U.S. PATENT DOCUMENTS

| | | | | |
|---|---|---|---|---|
| 6,100,195 A | * | 8/2000 | Chan | H01L 21/76849 257/E21.591 |
| 2001/0024933 A1 | * | 9/2001 | Sachan | C09G 1/02 451/41 |
| 2004/0248362 A1 | * | 12/2004 | Nakamura | H01L 21/7687 438/241 |
| 2004/0259348 A1 | * | 12/2004 | Basol | H01L 21/7684 438/622 |
| 2006/0286805 A1 | * | 12/2006 | Hsu | H01L 21/3212 438/689 |
| 2007/0144628 A1 | * | 6/2007 | Collins | H01L 21/2885 148/527 |
| 2008/0020934 A1 | * | 1/2008 | Yoshii | C23C 16/0209 505/100 |
| 2008/0276543 A1 | * | 11/2008 | Thomas | C09G 1/02 51/298 |
| 2009/0087339 A1 | * | 4/2009 | Shinriki | C23C 16/18 420/462 |
| 2010/0164074 A1 | * | 7/2010 | King | H01L 21/0206 257/635 |
| 2011/0198756 A1 | * | 8/2011 | Thenappan | C07F 17/02 257/751 |

(Continued)

*Primary Examiner* — Stephen M Bradley
*Assistant Examiner* — Wasiul Haider
(74) *Attorney, Agent, or Firm* — Maschoff Brennan

(57) ABSTRACT

A method includes forming a first metal into a first trench in a dielectric layer, performing a thermal treatment to the first metal such that an average grain size of the first metal is increased, and performing a first chemical mechanical polish (CMP) process to the first metal after the performing the thermal treatment.

17 Claims, 9 Drawing Sheets

(56) References Cited

U.S. PATENT DOCUMENTS

| | | | |
|---|---|---|---|
| 2013/0230982 A1* | 9/2013 | Morita | H01L 21/32051 |
| | | | 438/653 |
| 2014/0051246 A1* | 2/2014 | Kim | H01L 21/30625 |
| | | | 438/666 |
| 2015/0348831 A1* | 12/2015 | Brovman | H01L 21/76841 |
| | | | 438/653 |
| 2016/0005776 A1* | 1/2016 | Shimotsusa | H01L 27/14634 |
| | | | 250/208.1 |
| 2016/0276169 A1* | 9/2016 | Zhong | H01L 21/76864 |
| 2017/0170058 A1* | 6/2017 | Rha | H01L 23/53238 |
| 2017/0170063 A1* | 6/2017 | Edelstein | H01L 21/76883 |
| 2018/0068889 A1* | 3/2018 | Choi | H01L 21/76805 |
| 2018/0233372 A1* | 8/2018 | Vayrynen | H01L 21/28556 |
| 2018/0294180 A1* | 10/2018 | Jiang | H01L 21/7684 |
| 2018/0350665 A1* | 12/2018 | Chae | H01L 23/5283 |

* cited by examiner

SEMICONDUCTOR DEVICE AND FORMING METHOD THEREOF

BACKGROUND

Modern day integrated chips contain millions of semiconductor devices. The semiconductor devices are electrically interconnected by way of back-end-of-the-line metal interconnect layers that are formed above the devices on an integrated chip. The metal interconnect layers are conductive wires and vias that connect the semiconductor devices to one another and to the outside world (e.g., to pins of an integrated chip package).

Back-end-of-the-line metal interconnect layers are often formed using a dual damascene process. In a dual damascene process, a dielectric material is deposited (e.g., low k dielectric, ultra low k dielectric) onto the surface of a semiconductor substrate. The dielectric material is then selectively etched to form cavities in the dielectric material for a via layer and for an adjoining metal layer. In a via-first dual damascene process, a via hole is first etched in the dielectric material and then a metal line trench is formed on top of the via hole. After the via and trench are formed, a diffusion barrier layer and a seed layer are deposited within the cavities. An electro chemical platting process is then used to fill the via and metal trenches with metal (e.g., copper) at the same time. Finally, the surface of the substrate is planarized using a chemical mechanical polishing process to remove any excess metal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
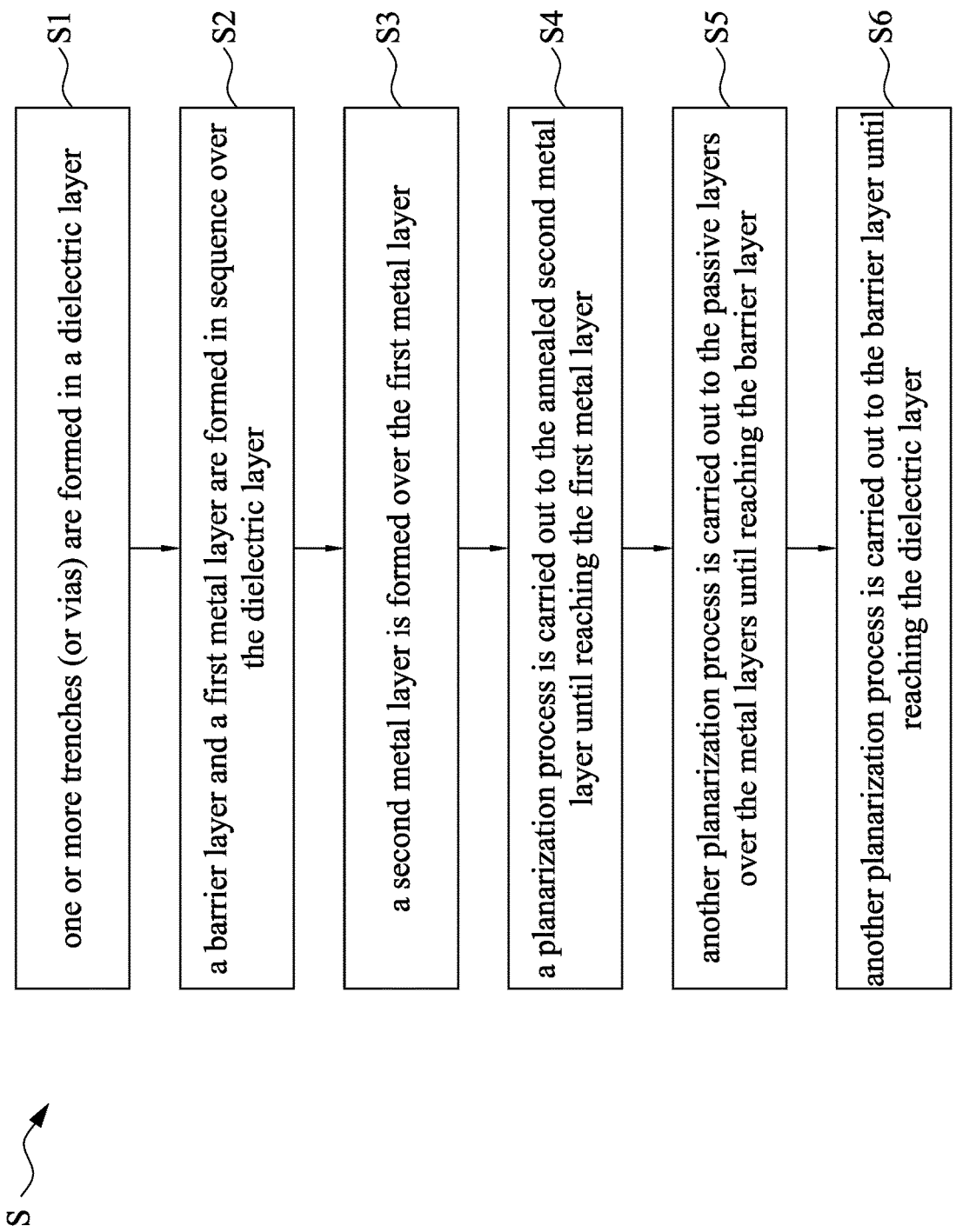
FIG. 1 is a flow chart of a method of a BEOL process in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Present disclosure presents embodiments in the form of a back-end-of-line (BEOL) process of fabricating an interconnection structure. The BEOL process includes interconnection of individual devices (e.g., transistors, capacitors, resistors, etc.) with wiring on a substrate (e.g., wafer), as well as formation of contacts, insulating layers, metal levels, and bonding sites for chip-to-package connections. Illustrated in FIG. 1 is a method S of BEOL process in accordance with some embodiments of the present disclosure. FIGS. 2-7 are cross-sectional views of some embodiments of a semiconductor device according to various stages of the method S of FIG. 1. The illustration is merely exemplary and is not intended to be limiting beyond what is specifically recited in the claims that follow. It is understood that additional operations may be provided before, during, and after the operations shown by FIG. 1, and some of the operations described below can be replaced or eliminated for additional embodiments of the method. The order of the operations/processes may be interchangeable.

Figure 2:
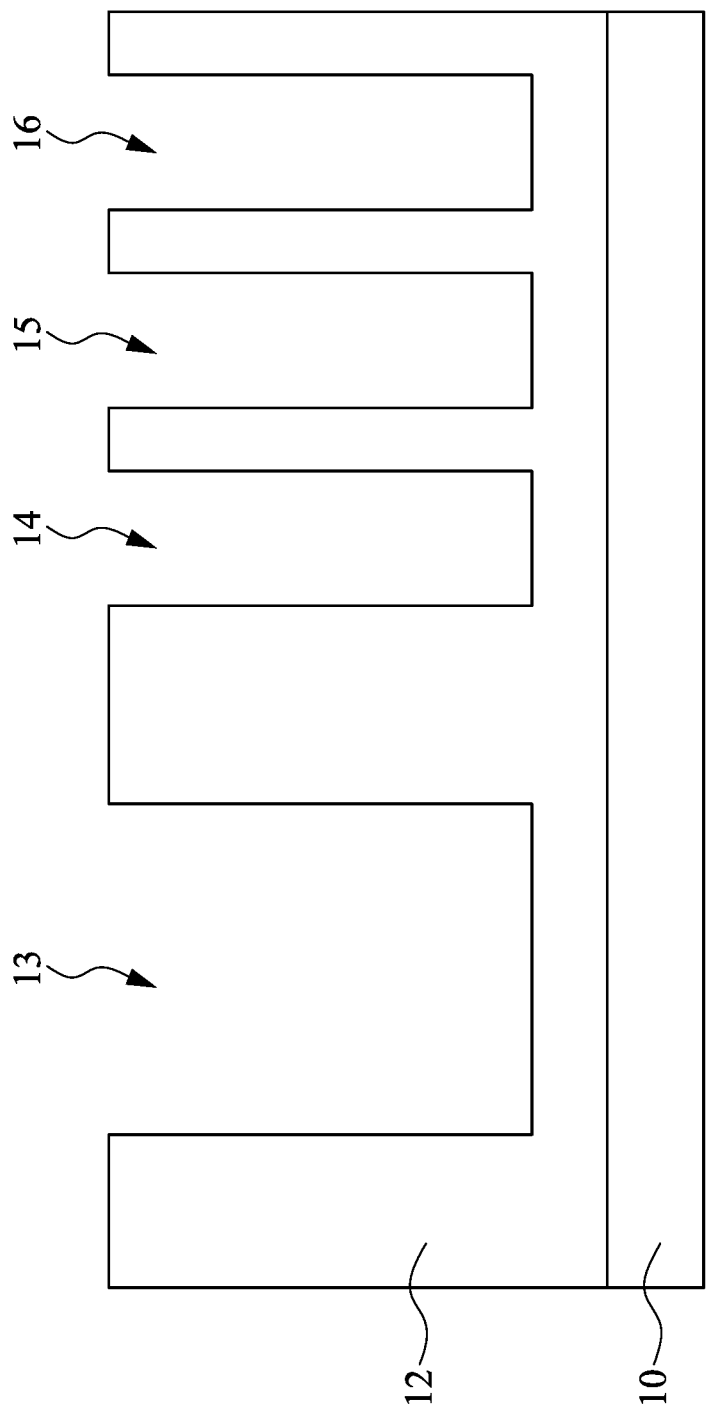
FIGS. 2-7 are cross-sectional views of some embodiments of a semiconductor device according to various stages of the method of FIG. 1.

The method S begins at block S1 where one or more trenches (or vias) are formed in a dielectric layer. With reference to FIG. 2, in some embodiments of block S1, trenches 13, 14, 15, and 16 are formed in a dielectric layer 12 over a substrate 10. In some embodiments, the substrate 10 may be a portion of a semiconductor wafer. For example, the substrate 10 may include silicon. The substrate 10 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the substrate 10 includes various doped regions for various microelectronic components, such as a complementary metal-oxide-semiconductor field-effect transistor (CMOSFET), imaging sensor, memory cell, and/or capacitive element. An etch stop layer (not shown) may be formed on the substrate 10. In addition to signaling the termination point of an etching process, the etch stop layer protects any underlying layer or layers during the etching process. The etch stop layer may comprise a plurality of layers. Materials for the etch stop layer may include SiC, SiN, TEOS, hard black diamond (HBD), or the like.

A dielectric layer 12 may be formed over the substrate 10, as shown in FIG. 2. The dielectric layer 12 may comprise a material, such as an oxide, $SiO_2$, borophosphosilicate glass (BPSG), TEOS, spin-on glass (SOG), undoped silicate glass (USG), fluorinated silicate glass (FSG), oxygen-doped SiC (ODC), high-density plasma (HDP) oxide, plasma-enhanced TEOS (PETEOS) or the like. The dielectric layer 12 may comprise a SiOC-based spin-on material that can be applied to or deposited by a spin-on method, such as spin coating. Alternatively, the dielectric layer 12 may be deposited by a chemical vapor deposition (CVD). An anti-reflective coating (ARC) layer may be optionally deposited on or intermediately in the dielectric layer 12, to attenuate or eliminate undesirable coherent light reflections from the surfaces of reflective underlying layer or layers desired to be patterned through photo-lithographic processes.

In some embodiments, a first trench 13 is formed in the dielectric layer 12 by photolithography and dry etching processes. In addition, using mask elements and etching processes, a plurality of second trenches 14, 15 and 16 are formed laterally separated from the first trench 13 to extend to reach a predetermined depth of the dielectric layer 12. In some embodiments, the first trench 13 and the second trenches 14-16 can be formed by the same photolithography and etching processes. In some other embodiments, the first trench 13 and the second trenches 14-16 can be formed by different photolithography and etching steps. In some embodiments, a depth of the first trench 13 is in a range from about 1 nm to about 100 nm. In some embodiments, depths of the second trenches 14, 15 and 16 are in a range from about 1 nm to about 100 nm. In some embodiments, the first trench 13 has a width in a range from about 1 nm to about 100 nm. In other embodiments, the first trench 13 has a width in a range from about 1 nm to about 10 nm. In some embodiments, the second trenches 14-16 have a width in a range from about 10 nm to about 100 nm. The width of the first trench 13 is greater than the widths of the second trenches 14-16.

Figure 3:
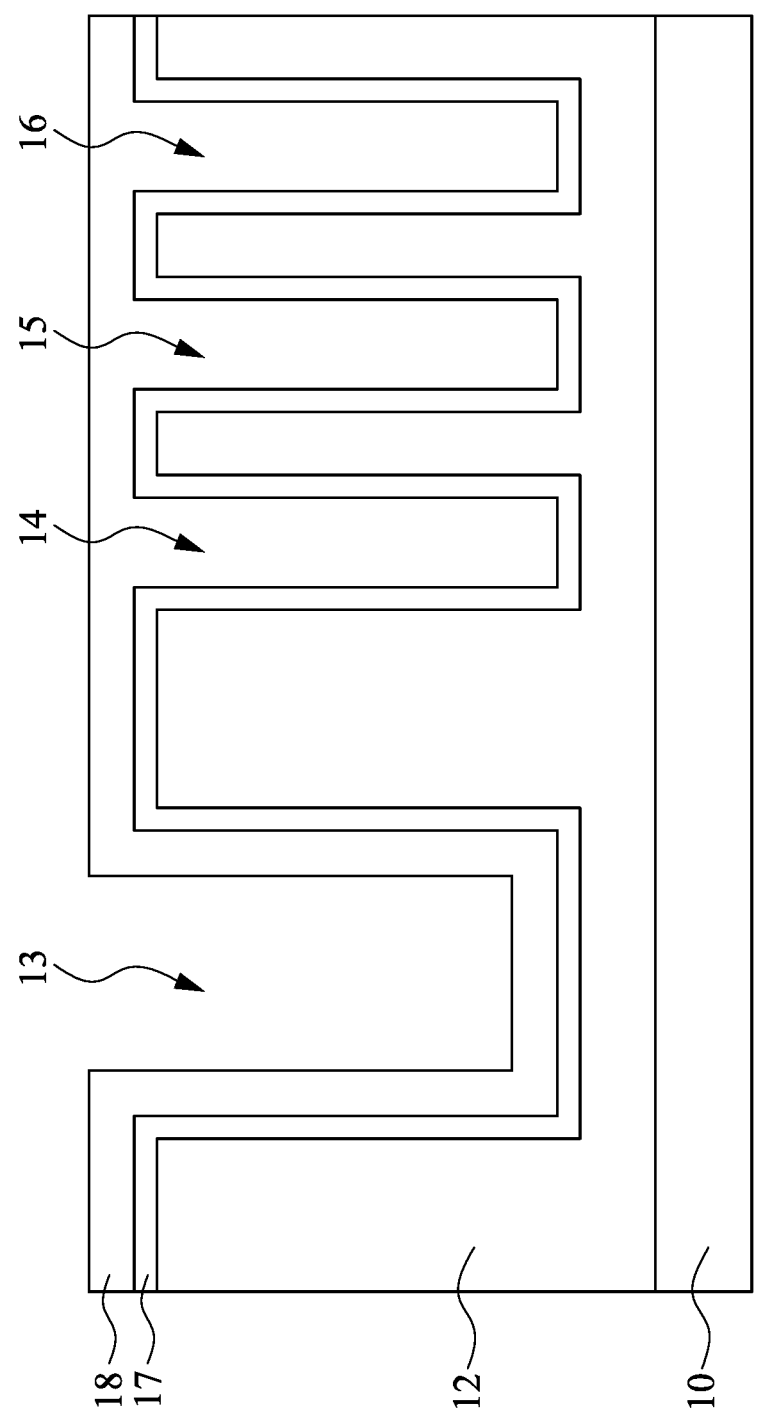

Returning to FIG. 1, the method S then proceeds to block S2 where a barrier layer and a first metal layer are formed in sequence over the dielectric layer. With reference to FIG. 3, in some embodiments of block S2, a barrier layer 17 is conformally formed over the dielectric layer 12, and a first metal layer 18 is then formed over the barrier layer 17. In the illustration, the barrier layer 17 conformally coats sidewalls and bottom surfaces of the first trench 13 and the second trenches 14-17. The barrier layer 17 may be formed using a process such as chemical vapor deposition (CVD), physical vapor deposition (PVD), plasma enhanced CVD (PECVD), plasma enhanced physical vapor deposition (PEPVD), atomic layer deposition (ALD), the like, or combinations thereof. The barrier layer 17 has higher diffusion resistance to the first metal layer 18 than that of the dielectric layer 12. Thus, the barrier layer 17 can reduce metal diffusion into the dielectric layer 12. By way of example, the first metal layer 18 is a copper layer, and the barrier layer 17 has higher copper diffusion resistance than that of the dielectric layer 12, and hence the barrier layer 17 can prevent copper diffusion into the dielectric layer 12. In some embodiments, the barrier layer 17 may comprise tantalum nitride, although other materials, such as tantalum, titanium, titanium nitride, the like, or combinations thereof.

As illustrated in FIG. 3, the first metal layer 18 fills the second trenches 14-16 while leaving the first trench 13 unfilled. In some embodiments, the first metal layer 18 has a thickness of about 1 nm to about 20 nm. In some embodiments, the first metal layer 18 may include copper (Cu), cobalt (Co), ruthenium (Ru), iridium (Ir), rhodium (Rh), platinum (Pt) or the like. The first metal layer 18 may be deposited by using physical vapor deposition (PVD), chemical vapor deposition (CVD), plasma enhanced CVD (PECVD), low pressure CVD (LPCVD), the like, or combinations thereof. In some embodiments, after the formation of the first metal layer 18, a thermal treatment, such as an anneal process, is performed on the substrate 10. The temperature of the annealing process ranges from about 200° C. to about 500° C. The anneal process may be a rapid thermal anneal (RTA) performed using a furnace, as examples.

Figure 4:
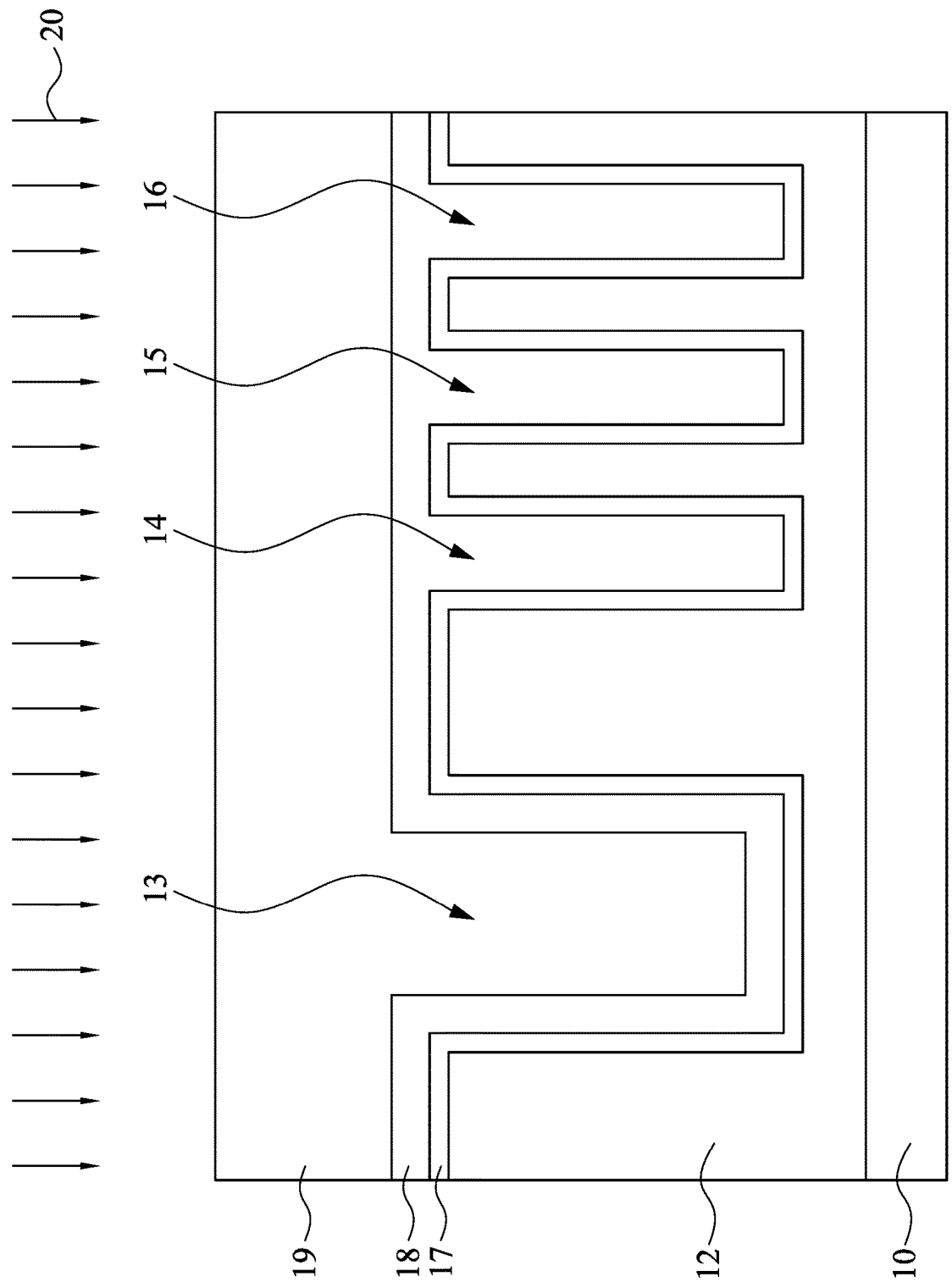

Returning to FIG. 1, the method S then proceeds to block S3 where a second metal layer is formed over the first metal layer. With reference to FIG. 4, in some embodiments of block S3, a deposition process, such as electro-chemical plating (ECP), electro-less plating (ELD) or PVD, is carried out to form a second metal layer 19 on the first metal layer 18 and to fill the remaining first trench 13. As illustrated, the second metal layer 19 fills a recess in the first metal layer 18. The second trenches 14-16 are free from the second metal layer 19 because they are filled by the first metal layer 18 in a previous step. In some embodiments, the second metal layer 19 is a copper (Cu) layer. In other embodiments, the second metal layer 19 is a ruthenium (Ru) layer. The second metal layer 19 may be made of a material different from that of the first metal layer 18. In some embodiments where the second metal layer 19 is a copper layer, an average grain size of the copper layer 19 is in a range from about 0.1 μm to about 0.5 μm. In the copper layer 19, some copper grains have a (111) crystal orientation, and some copper grains have a (200) crystal orientation. Copper grains having the (200) crystal orientation in the copper layer 19 are more than copper grains having the (111) crystal orientation in the copper layer 19. That is to say, an intensity of the (200) crystal orientation of the copper layer 19 is higher than an intensity of the (111) crystal orientation of the copper layer 19. Stated in another way, the copper layer 19 has a crystal orientation ratio of (200) to (111) that is greater than 1. In some embodiments where the second metal layer 19 is a ruthenium layer, an average grain size of the ruthenium layer 19 is in a range from about 0.1 μm to about 0.5 μm. The ruthenium layer 19 is formed along (101), (002) and (100) crystal orientations, and an intensity ratio of the (101) crystal orientation, the (002) crystal orientation, and the (100) crystal orientation of the ruthenium layer 19 may satisfy: 3:2:1, in accordance with some embodiments. Stated in another way, the ruthenium layer 19 has a crystal orientation ratio of (101):(002):(100) substantially equal to 3:2:1.

After the formation of the second metal layer 19, a thermal treatment 20, for example an annealing process, is carried out to the second metal layer 19, as shown in FIG. 4. Conditions of the thermal treatment 20 are selected to increase an average grain size of the second metal layer 19 and to change crystal orientation ratio of the second metal layer 19. By way of example, the duration of the annealing process may range from about 10 minutes to about 60 minutes and at a temperature ranging from about 200° C. to about 500° C. In some embodiments, the annealing process may be an RTA process performed using a furnace. In some other embodiments, the annealing process may be performed using thermal soaking or the like. The thermal soaking treats the second metal layer 19 with a hydrogen gas, at between from about 200° C. to about 500° C., with current density between about 3 A to about 20 A, with reaction time at processing temperature ranges from about 10 minutes to about 60 minutes. After performing the annealing process, average grain size of the annealed second metal layer 19 is greater than 1 μm. In some embodiments, the thermal treatment 20 also increases an average grain size of the first metal layer 18 in the second trenches 14-16. The increasing of the average grain size of the second metal layer 19 is greater than the increasing of the average grain size of the first metal layer 18 because the increasing of the average grain size of the first metal layer 18 is constrained by second trenches 14-16 narrower than the first trench 13.

In some embodiments where the second metal layer 19 is a copper layer, the thermal treatment 20 changes the crystal orientation ratio of the copper layer. By way of example, the thermal treatment 20 may increase copper grains having the (111) crystal orientation, so that an intensity of the (111) crystal orientation of the annealed copper layer 19 is higher than an intensity of the (200) crystal orientation of the annealed copper layer 19. Stated in another way, the annealed copper layer 19 has more copper grains having the (200) crystal orientation than copper grains having the (111) crystal orientation. In some embodiments, the annealed copper layer 19 has a crystal orientation ratio of (111) to (200) that is greater than 2.

In some embodiments where the annealed second metal layer 19 is a ruthenium layer, the thermal treatment 20 also changes the crystal orientation ratio of the ruthenium layer. By way of example, the thermal treatment 20 may increase ruthenium grains having the (002) crystal orientation, so that an intensity of the (002) crystal orientation is higher than either an intensity of the (101) crystal orientation or an intensity of the (100) crystal orientation. Stated in another way, the annealed ruthenium layer 19 has more ruthenium grains having the (002) crystal orientation than either ruthenium grains having the (101) crystal orientation or ruthenium grains having the (100) crystal orientation. In some embodiments, the annealed ruthenium layer 19 has a crystal orientation ratio of (002) to (101) that is not less than 3. Alternatively, the annealed ruthenium layer 19 has a crystal orientation ratio of (002) to (100) that is not less than 3.

Figure 5:
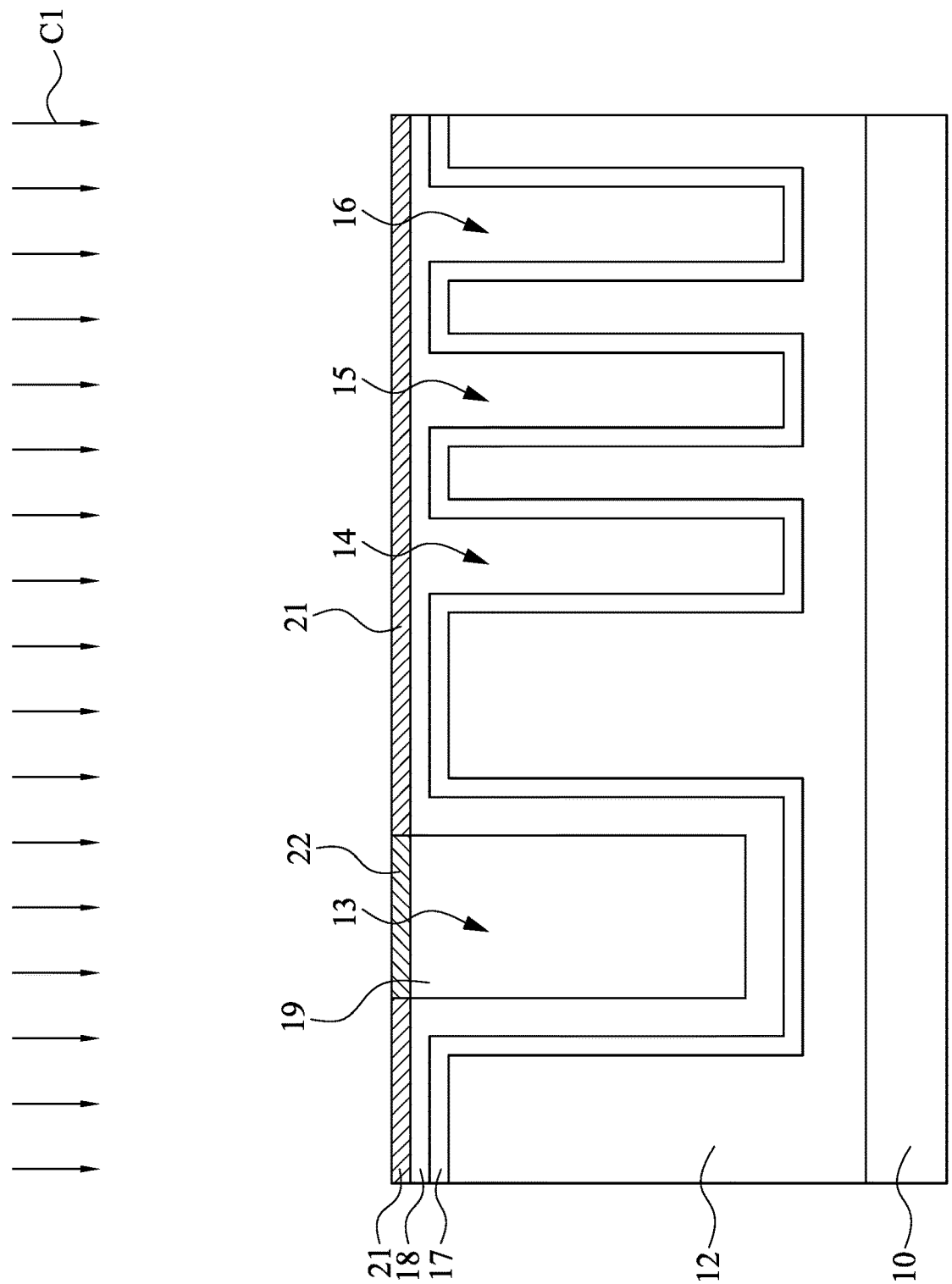

Returning to FIG. 1, the method S then proceeds to block S4 where a planarization process is carried out to the annealed second metal layer until reaching the first metal layer. With reference to FIG. 5, in some embodiments of block S4, portions of the annealed second metal layer 19 outside the first trench 13 and over the second trenches 14-16 are removed, while remaining a portion of the annealed second metal layer 19 in the first trench 13. In some embodiments, the planarization includes a chemical mechanical polish (CMP) process C1, which is also referred to as a chemical mechanical planarization process C1.

CMP is a process that utilizes the reagent within a slurry to react chemically with the annealed second metal layer 19, and produces an easily polished layer. The CMP process C1 employs the slurry that is selective to the annealed second metal layer 19, and thus the underlying first metal layer 18 may function as a CMP stop layer in the CMP process C1. Stated in another way, the first metal layer 18 has a higher resistance to the CMP process C1 than that of the annealed second metal layer 19. By way of example, conditions of the CMP process C1 is selected such that the annealed second metal layer 19 has a lower resistance to the CMP process C1 than that of the first metal layer 18. Therefore, the polishing rate of the first metal layer 18 is slower than the polishing rate of the annealed second metal layer 19 in the CMP process C1. In this way, the CMP process C1 is performed until reaching the first metal layer 18.

As noted above, the annealing process performed to the second metal layer 19 increases the average grain size, which in turn will improve the resistance of the annealed second metal layer 19 to the CMP process C1, which in turn will reduce dishing of the annealed second metal layer 19. Moreover, it is understood that the texture intensity of copper formed as (111) is stronger than a texture intensity of copper formed as other orientations. In some embodiments where the second metal layer 19 is made of copper, the annealed second metal layer 19 includes copper grains having the (111) crystal orientation more than copper grains having the (200) orientation, which in turn will improve the resistance of the annealed second metal layer 19 to the CMP process C1, which in turn will reduce dishing of the annealed second metal layer 19. Further, it is also understood that a texture intensity of the ruthenium formed as (002) is stronger than a texture intensity of ruthenium formed as other orientations. In some embodiments where the second metal layer 19 is made of ruthenium, the annealed second metal layer 19 includes ruthenium grains having the (002) crystal orientation more than ruthenium grains having the (101) orientation or ruthenium grains having the (100) orientation, which in turn will improve the resistance of the annealed second metal layer 19 to the CMP process C1, which in turn will reduce dishing of the annealed second metal layer 19.

In some embodiments, the process conditions during CMP process C1 may include applying a CMP down force of about 1 psi to about 3.5 psi, applying abrasive particles such as colloidal $SiO_2$, $Al_2O_3$, or $CeO_2$ based CMP slurries, the like, or combinations thereof. Other CMP process conditions may be applied in other embodiments. In some examples, the pH level of the slurry is kept between about 6 to about 8. The slurry may include other components such as a wetting agent or surfactant. Together with the abrasive action provided by the abrasive particles in the slurry under a polishing pad, the annealed second metal layer 19 is gradually removed. After the CMP process C1, de-ionized water may be used to clear away residue from the CMP process C1, such as slurry and abrasive particles on the substrate 10.

The slurry used in the CMP process C1 optionally includes an oxidant, and hence a surface layer (i.e. a topmost portion) of the remaining first metal layer 18 is passivated (or oxidized) to form a first passivation layer 21 after the CMP process C1. Similarly, a surface layer of the remaining annealed second metal layer 19 is passivated to form a second passivation layer 22. Formation of the second passivation layer 22 may be advantageous for reducing dishing of the annealed second metal layer 19. In some embodiments, the oxidant is $H_2O_2$ or the like, and the concentration of the oxidant in the slurry may range from about 0.5% to about 10%. The first and second passivation layers 21 and 22 can serve as protective layers that prevent the underlying layers (e.g. first metal layer 18 and the annealed second metal layer 19) from oxidation. In some embodiments, a chemical element in the first passivation layer 21 is the same as a chemical element in the first metal layer 18 because the first passivation layer 21 is converted from the surface layer of the first metal layer 18. Similarly, a chemical element in the second passivation layer 22 is the same as a chemical element in the annealed second metal layer 19 because the second passivation layer 22 is converted from the surface layer of the annealed second metal layer 19. In some embodiments where the first metal layer 18 is made of a metal different from the annealed second metal layer 19, the first and second passivation layers 21 and 22 have different metal elements.

Figure 6:
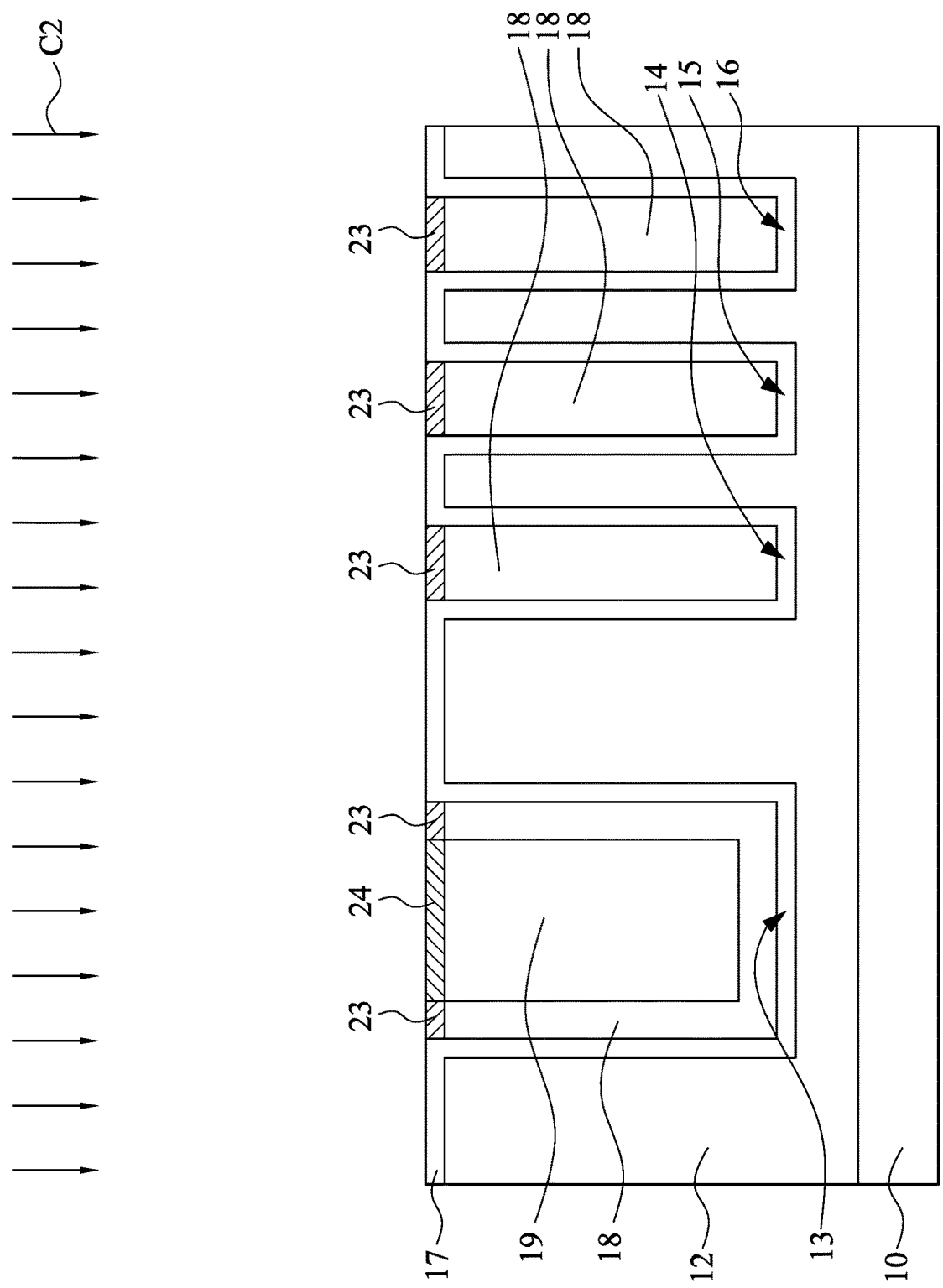

Returning to FIG. 1, the method S then proceeds to block S5 where another planarization process is carried out to the passivation layers over the metal layers until reaching the barrier layer. With reference to FIG. 6, in some embodiments of block S5, passivation layers 21 and 22 and some portions of the first metal layer 18 are removed by the planarization process until the barrier layer 17 is exposed. After the planarization process, portions of the first metal layer 18 remain in the respective first and second trenches 13-16 and are separated from each other. In some embodiments, the planarization process is a CMP process C2. The CMP process C2 employs the slurry that is selective to the first metal layer 18, and thus the underlying barrier layer 17 may function as a CMP stop layer in the CMP process C2. Stated in another way, the barrier layer 17 has a higher resistance to the CMP process C2 than that of the first metal layer 18. By way of example, conditions of the CMP process C2 is selected such that the first metal layer 18 has a lower resistance to the CMP process C2 than that of the barrier layer 17. Therefore, the polishing rate of the barrier layer 17 is slower than the polishing rate of the first metal layer 18 in the CMP process C2. In this way, the CMP process C2 is performed until reaching the barrier layer 17. In some embodiments, the annealed second metal layer 19 has a higher resistance to the CMP process C2 than that of the first metal layer 18, so as to reduce dishing of the annealed second metal layer 19 during the CMP process C2.

As noted above, the annealing process performed to the second metal layer 19 increases the average grain size, which in turn will increase the resistance of the annealed second metal layer 19 to the CMP process C2, which in turn will reduce dishing of the annealed second metal layer 19. Moreover, it is understood that the texture intensity of copper formed as (111) is stronger than a texture intensity of copper formed as other orientations. In some embodiments where the second metal layer 19 is made of copper, the annealed second metal layer 19 includes copper grains having the (111) crystal orientation more than copper grains having the (200) orientation, which in turn will improve the resistance of the annealed second metal layer 19 to the CMP process C2, which in turn will reduce dishing of the annealed second metal layer 19. Further, it is also understood that a texture intensity of the ruthenium formed as (002) is stronger than a texture intensity of ruthenium formed as other orientations. In some embodiments where the second metal layer 19 is made of ruthenium, the annealed second metal layer 19 includes ruthenium grains having the (002) crystal orientation more than ruthenium grains having the (101) orientation or ruthenium grains having the (100) orientation, which in turn will improve the resistance of the annealed second metal layer 19 to the CMP process C2, which in turn will reduce dishing of the annealed second metal layer 19.

In some embodiments, the process conditions during CMP process C2 may include applying a CMP down force of about 0.5 psi to about 2.0 psi, applying abrasive particles such as colloidal $SiO_2$, $Al_2O_3$, or $CeO_2$ based CMP slurries, the like, or combinations thereof. Other CMP process conditions may be applied in other embodiments. In some examples, the pH level of the slurry is kept between about 3 to about 8. The slurry may include other components such as a wetting agent or surfactant. In some embodiments, the slurry may include a reducer to reduce metal dishing, and the reducer concentration may be in a range from about 1.5% to about 3%.

The slurry used in the CMP process C2 optionally includes an oxidant, and hence a surface layer (i.e. a topmost portion) of the remaining first metal layer 18 is passivated (or oxidized) to form a third passivation layer 23 after the CMP process C2. Similarly, a surface layer of the remaining annealed second metal layer 19 is passivated to form a fourth passivation layer 24. Formation of the fourth passivation layer 24 may be advantageous for reducing dishing of the annealed second metal layer 19. In some embodiments, the oxidant is $H_2O_2$ or the like, and the concentration of the oxidant in the slurry may range from about 0.5% to about 10%. The third and fourth passivation layers 23 and 24 can serve as protective layers that prevent the underlying layers (e.g. first metal layer 18 and the annealed second metal layer 19) from oxidation. In some embodiments, a chemical element in the third passivation layer 23 is the same as a chemical element in the first metal layer 18 because the third passivation layer 23 is converted from the surface layer of the first metal layer 18. Similarly, a chemical element in the fourth passivation layer 24 is the same as a chemical element in the annealed second metal layer 19 because the fourth passivation layer 24 is converted from the surface layer of the annealed second metal layer 19. In some embodiments where the first metal layer 18 is made of a metal different from the annealed second metal layer 19, the third and fourth passivation layers 23 and 24 have different metal elements.

Figure 7:
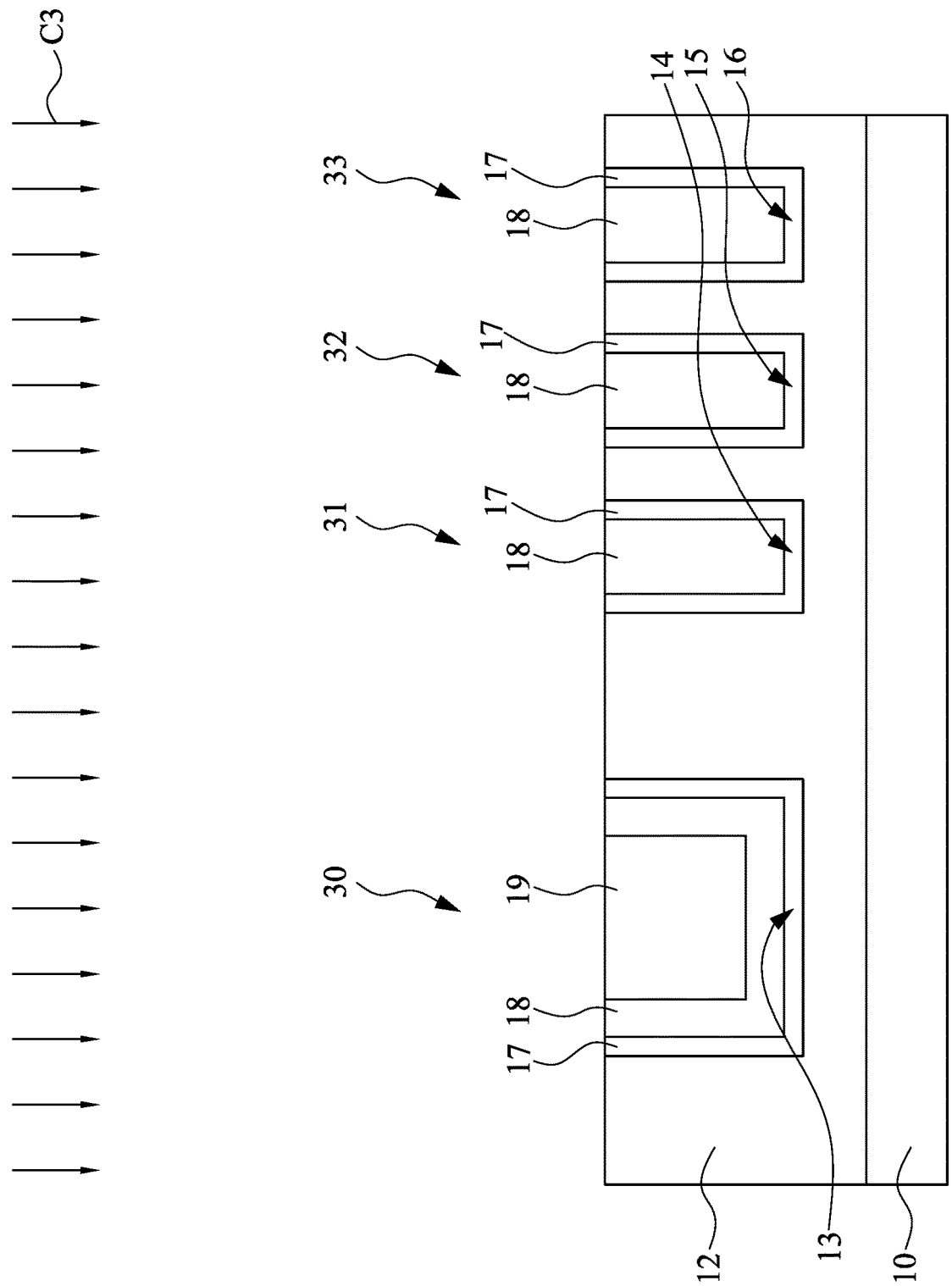

Returning to FIG. 1, the method S then proceeds to block S6 where another planarization process is carried out to the barrier layer until reaching the dielectric layer. With reference to FIG. 7, in some embodiments of block S6, passivation layers 23 and 24, and some portions of the barrier layer 17 are removed by the planarization process until the dielectric layer 12 is exposed. After the planarization process, portions of the barrier layer 17 remain in the respective first and second trenches 13-16 and are separated from each other. Metals remained in the first trench 13 (e.g., barrier layer 17, first metal layer 18 and annealed second metal layer 19) are in combination referred to as a metal line (or metal via) 30. Metals remained in the second trenches 14-16 (e.g., the barrier layer 17 and the first metal layer 18) are in combination referred to as metal lines (or metal vias) 31, 32 and 33. The metal lines 30-33 are embedded in the dielectric layer 12 and separated from each other by the dielectric layer 12.

In some embodiments, the planarization process is a CMP process C3. The CMP process employs the slurry that is selective to the barrier layer 17, and thus the underlying dielectric layer 12 may function as a CMP stop layer in the CMP process C3. Stated in another way, the dielectric layer 12 has a higher resistance to the CMP process C3 than that of the barrier layer 17. By way of example, conditions of the CMP process C3 is selected such that the barrier layer 17 has a lower resistance to the CMP process C3 than that of the dielectric layer 12. Therefore, the polishing rate of the dielectric layer 12 is slower than the polishing rate of the barrier layer 17. In this way, the CMP process is performed until reaching the dielectric layer 12.

In some embodiments, the process conditions during CMP process C3 may include applying a CMP down force of about 0.7 psi to about 1.75 psi, applying abrasive particles such as colloidal $SiO_2$, $Al_2O_3$, or $CeO_2$ based CMP slurries, the like, or combinations thereof. Other CMP process conditions may be applied in other embodiments. In some examples, the pH level of the slurry is kept between about 9 to about 11. The slurry may include other components such as a wetting agent or surfactant.

In some embodiments, the slurry used in the CMP process C3 may not include an oxidant as used in the previous CMP processes C1 and C2, and hence no passivation layers are formed in this CMP process C3. As noted above, the annealing process performed to the second metal layer 19 increases the average grain size of the second metal layer 19, which in turn will increase the resistance of the annealed second metal layer 19 to the CMP process C3, which in turn will reduce dishing of the annealed second metal layer 19. Moreover, it is understood that the texture intensity of copper formed as (111) is stronger than a texture intensity of copper formed as other orientations. In some embodiments where the second metal layer 19 is made of copper, the annealed second metal layer 19 includes copper grains having the (111) crystal orientation more than copper grains having the (200) crystal orientation, which in turn will improve the resistance of the annealed second metal layer 19 to the CMP process C3, which in turn will reduce dishing of the annealed second metal layer 19. Further, it is also understood that a texture intensity of the ruthenium formed as (002) is stronger than a texture intensity of ruthenium formed as other orientations. In some embodiments where the second metal layer 19 is made of ruthenium, the annealed second metal layer 19 includes ruthenium grains having the (002) crystal orientation more than ruthenium grains having the (101) orientation or ruthenium grains having the (100) orientation, which in turn will improve the resistance of the annealed second metal layer 19 to the CMP process C3, which in turn will reduce dishing of the annealed second metal layer 19.

As a result of reduced dishing effect of the annealed second metal layer 19, after the CMP process C3, a top surface of the annealed second metal layer 19 may have substantially the same shape as a top surface of the first metal layer 18. For example, after the CMP process C3, the top surfaces of the first and second metal layers 18 and 19 may be substantially planar and substantially level with each other, as illustrated in FIG. 7.

Figure 8:
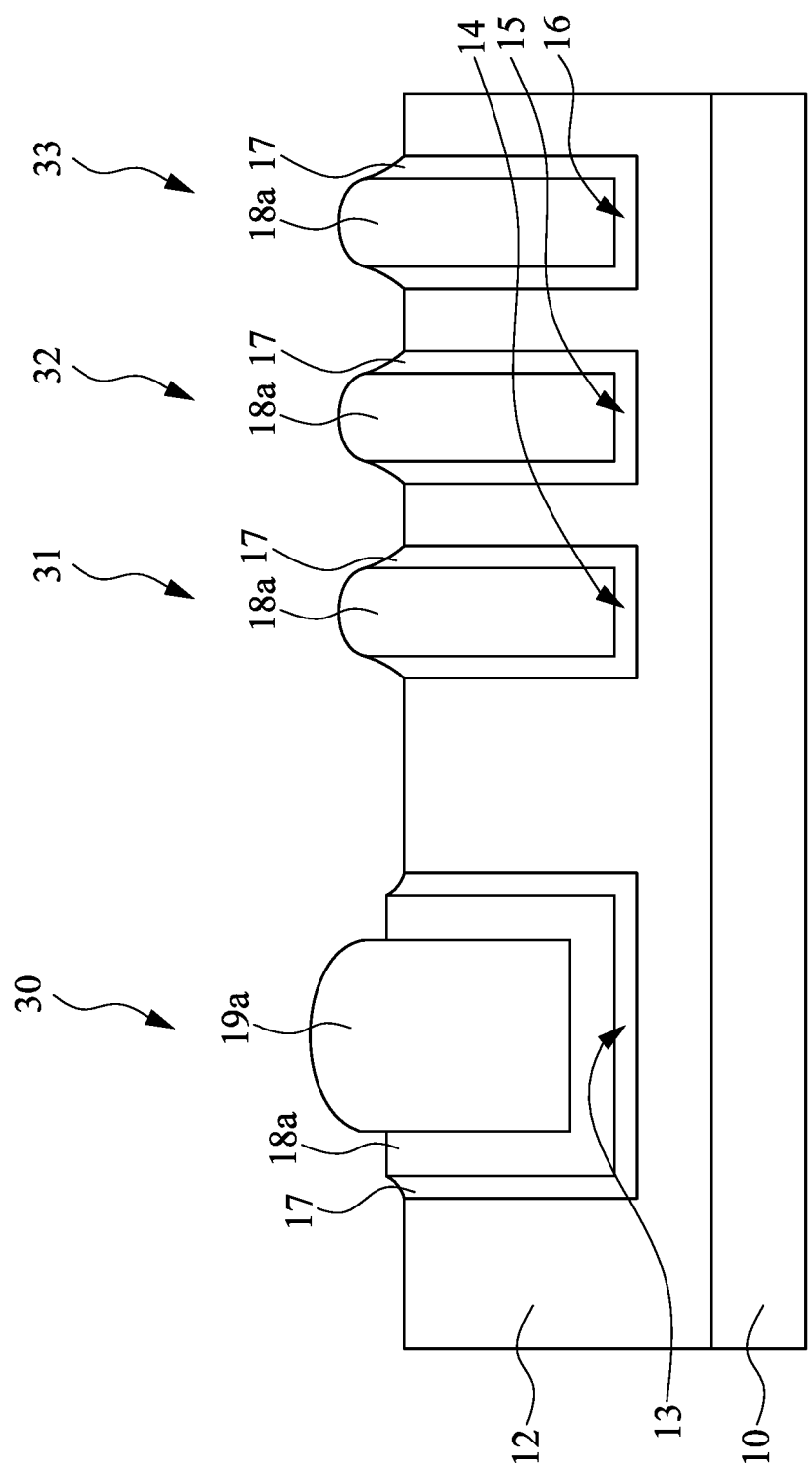
FIG. 8 is a cross-sectional view of a semiconductor device according to some embodiments of the present disclosure.
Figure 9:
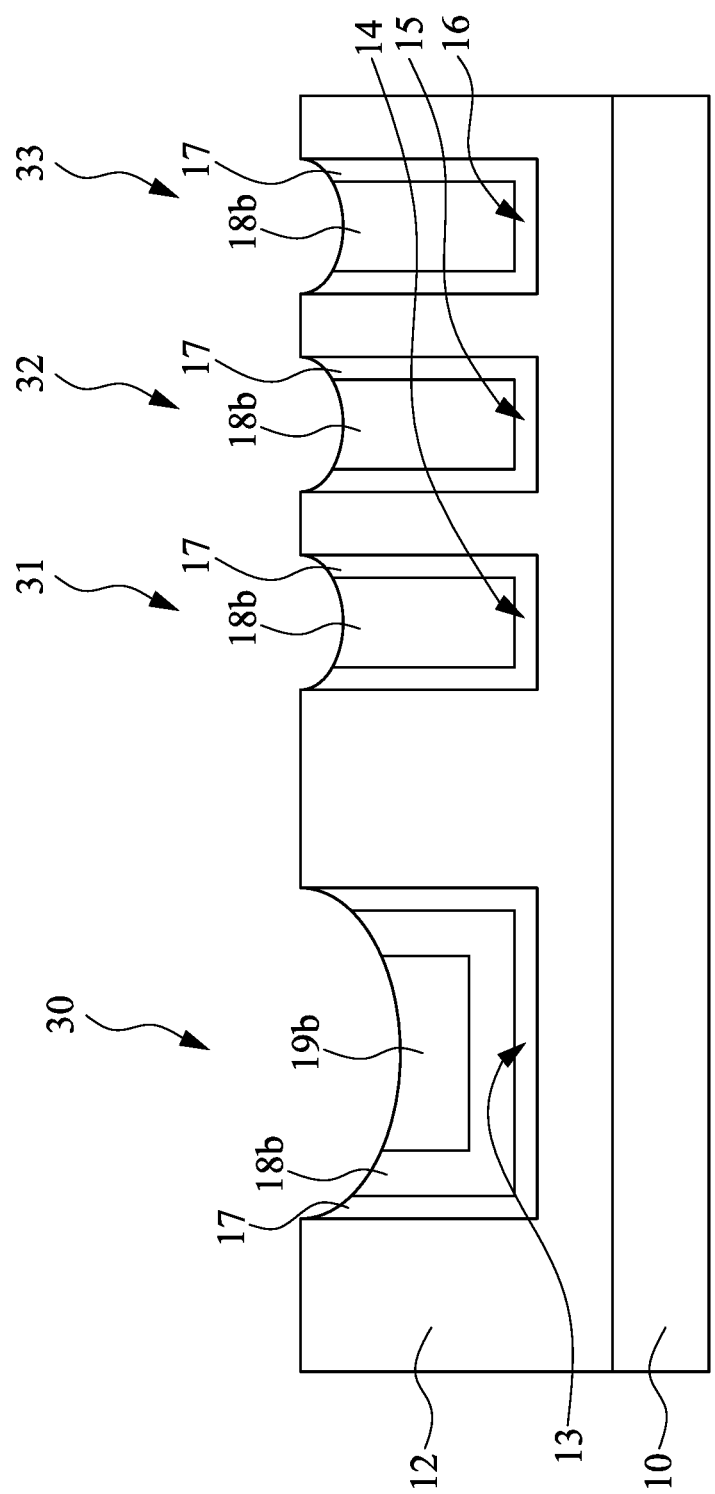
FIG. 9 is a cross-sectional view of a semiconductor device according to some embodiments of the present disclosure.

In some other embodiments, the top surfaces of the first and second metal layers may be not planar. For example, illustrated in FIG. 8 is a cross-sectional view of some embodiments of another semiconductor device after performing the CMP process C3. With reference to FIG. 8, the first metal layer 18a and the annealed second metal layer 19a have convex top surfaces. In some embodiments, peaks of the convex top surfaces of the first metal layer 18a and the annealed second metal layer 19a are substantially at the same height or elevation that is higher than a top surface of the dielectric layer 12. Illustrated in FIG. 9 is a cross-sectional view of some embodiments of another semiconductor device after performing the CMP process C3. With reference to FIG. 9, the first metal layer 18b and the annealed second metal layer 19b have concave top surfaces. In some embodiments, troughs of the concave top surfaces of the first metal layer 18b and the annealed second metal layer 19b are substantially at the same height or elevation that is lower than the top surface of the dielectric layer 12.

In some embodiments, a method comprises forming a first metal into a first trench in a dielectric layer; performing a thermal treatment to the first metal such that an average grain size of the first metal is increased; and performing a first chemical mechanical polish (CMP) process to the first metal after the performing the thermal treatment.

In some embodiments, the method further comprises forming a second metal, different from the first metal, into a second trench in the dielectric layer. The second trench is narrower than the first trench.

In some embodiments, the thermal treatment is performed further such that an average grain size of the second metal is increased.

In some embodiments, the increasing of the average grain size of the first metal is greater than the increasing of the average grain size of the second metal.

In some embodiments, the second trench is free from the first metal.

In some embodiments, the forming the second metal is prior to the forming the first metal.

In some embodiments, the second metal is further formed into the first trench in the dielectric layer. The first metal is formed on the second metal.

In some embodiments, the first metal is formed to fill a recess in the second metal in the first trench.

In some embodiments, the second metal has a higher resistance to the first CMP process than that of the first metal.

In some embodiments, the method further comprises performing a second CMP process to the second metal. The first metal has a higher resistance to the second CMP process than that of the second metal.

In some embodiments, the method further comprises forming a barrier layer into the first and second trenches in the dielectric layer prior to the forming the first metal and the forming the second metal; and performing a third CMP process to the barrier layer after the performing the second CMP process. The dielectric layer has a higher resistance to the third CMP process than that of the barrier layer.

In some embodiments, the second CMP process is performed such that a surface layer of the first metal is passivated.

In some embodiments, the first CMP process is performed such that a surface layer of the first metal is passivated.

In some embodiments, a method comprises forming a first metal having a first crystal orientation ratio into a first trench in a dielectric layer; performing a thermal treatment to the first metal to form a treated first metal; and performing a chemical mechanical polish (CMP) process to the treated first metal. The treated first metal has a second crystal orientation ratio different from the first crystal orientation ratio.

In some embodiments, the first metal has a first average grain size. The treated first metal has a second average grain size greater than the first average grain size.

In some embodiments, the thermal treatment increases copper grains of the first metal having a (111) crystal orientation.

In some embodiments, the thermal treatment increases ruthenium grains of the first metal having a (002) crystal orientation.

In some embodiments, the method further comprises forming a second metal into the first trench and a second trench in the dielectric layer prior to the forming the first metal. The second metal fills the second trench and does not fill the first trench.

In some embodiments, an interconnection structure comprises a dielectric layer over a semiconductor substrate; and a first metal embedded in the dielectric layer. A (111) crystal orientation of the first metal is greater than a (200) crystal orientation of the first metal, or a (002) crystal orientation greater of the first metal is greater than a (101) crystal orientation of the first metal.

In some embodiments, the interconnection structure further comprises a second metal embedded in the dielectric layer. The second metal is between the first metal and the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first metal into a first trench in a dielectric layer;
forming a second metal over the first metal;
performing a thermal treatment to the second metal such that an average grain size of the second metal is increased;
performing, using a first slurry, a first chemical mechanical polish (CMP) process to the second metal after the performing the thermal treatment, wherein the first CMP process uses the first metal as a CMP stop layer;
after performing the first CMP process, oxidizing a surface layer of the first metal and a surface layer of the second metal; and
performing, using a second slurry, a second CMP process to the oxidized surface layer of the first metal and the oxidized surface layer of the second metal.

2. The method of claim 1, wherein the first metal is different from the second metal and is formed into a second trench in the dielectric layer, and the second trench is narrower than the first trench.

3. The method of claim 2, wherein the thermal treatment is performed further such that an average grain size of the first metal is increased.

4. The method of claim 3, wherein the increasing of the average grain size of the second metal is greater than the increasing of the average grain size of the first metal.

5. The method of claim 2, wherein the second trench is free from the second metal.

6. The method of claim 2, wherein the first metal has a higher resistance to the first CMP process than that of the second metal.

7. The method of claim 1, wherein the second metal is formed to fill a recess in the first metal in the first trench.

8. The method of claim 1, wherein the second metal has a higher resistance to the second CMP process than that of the first metal.

9. The method of claim 1, further comprising:
forming a barrier layer into the first trench in the dielectric layer prior to the forming the first metal and the forming the second metal, wherein the barrier layer has a higher resistance to the second CMP process than that of the first metal.

10. The method of claim 1, wherein the first metal comprises a ruthenium-containing material and the second metal comprises a copper-containing material.

11. The method of claim 1, wherein the thermal treatment is performed by a thermal soaking with a hydrogen gas.

12. A method, comprising:
forming a barrier layer in a first trench in a dielectric layer;
forming a first metal having a first crystal orientation ratio over the barrier layer;
performing a first thermal treatment to the first metal to form a treated first metal, wherein the treated first metal has a second crystal orientation ratio different from the first crystal orientation ratio;
after performing the first thermal treatment to the first metal, forming a second metal over and in contact with the treated first metal;
performing a second thermal treatment to the second metal to form a treated second metal;
after the performing the second thermal treatment, performing at least one chemical mechanical polish (CMP) process to the treated first and second metals using the barrier layer as a CMP stop layer;
after performing the at least one CMP process, oxidizing a surface layer of the treated first metal and a surface layer of the treated second metal; and
removing the oxidized surface layer of the treated first metal and the oxidized surface layer of the treated second metal.

13. The method of claim 12, wherein the first metal has a first average grain size, and the treated first metal has a second average grain size greater than the first average grain size.

14. The method of claim 12, wherein the first thermal treatment increases ruthenium grains of the first metal having a (002) crystal orientation greater than a (101) crystal orientation thereof.

15. The method of claim 12, wherein the first metal forms into a second trench narrower than the first trench in the dielectric layer, and the second metal does not fill the first trench.

16. The method of claim 12, wherein a portion of a second metal is below a topmost surface of the dielectric layer.

17. The method of claim 12, wherein oxidizing the surface layer of the treated first metal and the surface layer of the treated second metal is performed without oxidizing the barrier layer.

* * * * *